United States Patent [19]

Woessner

[11] 4,023,142
[45] May 10, 1977

[54] COMMON DIAGNOSTIC BUS FOR COMPUTER SYSTEMS TO ENABLE TESTING CONCURRENTLY WITH NORMAL SYSTEM OPERATION

[75] Inventor: Robert J. Woessner, Stewartville, Minn.

[73] Assignee: International Business Machines Corporation, Armonk, N.Y.

[22] Filed: Apr. 14, 1975

[21] Appl. No.: 568,094

[52] U.S. Cl. .......................... 340/172.5; 235/153 R
[51] Int. Cl.² ...................................... G06F 11/00
[58] Field of Search .................... 340/172.5; 445/1; 235/153

[56] References Cited
UNITED STATES PATENTS

| | | | |
|---|---|---|---|
| 3,641,505 | 2/1972 | Artz et al. | 340/172.5 |
| 3,668,644 | 6/1972 | Looschen et al. | 340/172.5 |
| 3,768,074 | 10/1973 | Sharp et al. | 340/172.5 |
| 3,786,430 | 1/1974 | Hajdu et al. | 340/172.5 |
| 3,825,901 | 7/1974 | Golnek et al. | 340/172.5 |
| 3,828,321 | 8/1974 | Wilber et al. | 340/172.5 |
| 3,876,987 | 4/1975 | Dalton et al. | 340/172.5 |

*Primary Examiner*—Mark E. Nusbaum

*Attorney, Agent, or Firm*—Donald F. Voss

[57] ABSTRACT

A common reliability and serviceability (RAS) bus is connected to each functional combination of LSI apparatus, i.e., storage control, central processing unit (CPU), input/output (I/O) attachments and devices, and system control adapter constituting a computer system. The common RAS bus includes a unique address line to facilitate discrete addressing of each functional unit from the system control adapter. Logic is included in each I/O type of functional unit which is responsive to the address signal and a test mode signal for degating or blocking data normally transferring between the functional units.

Other logic provides control signals for causing the addressed functional unit to go thru one clock cycle, one shift cycle, one machine cycle or one instruction cycle. This enables the addressed unit to go thru an operation after a test pattern has been loaded into the functional unit while the system continues to operate concurrently, if the addressed unit is other than the CPU. The status of the addressed unit is then checked by the system control adapter.

19 Claims, 16 Drawing Figures

LSSD SRL CONFIGURATION

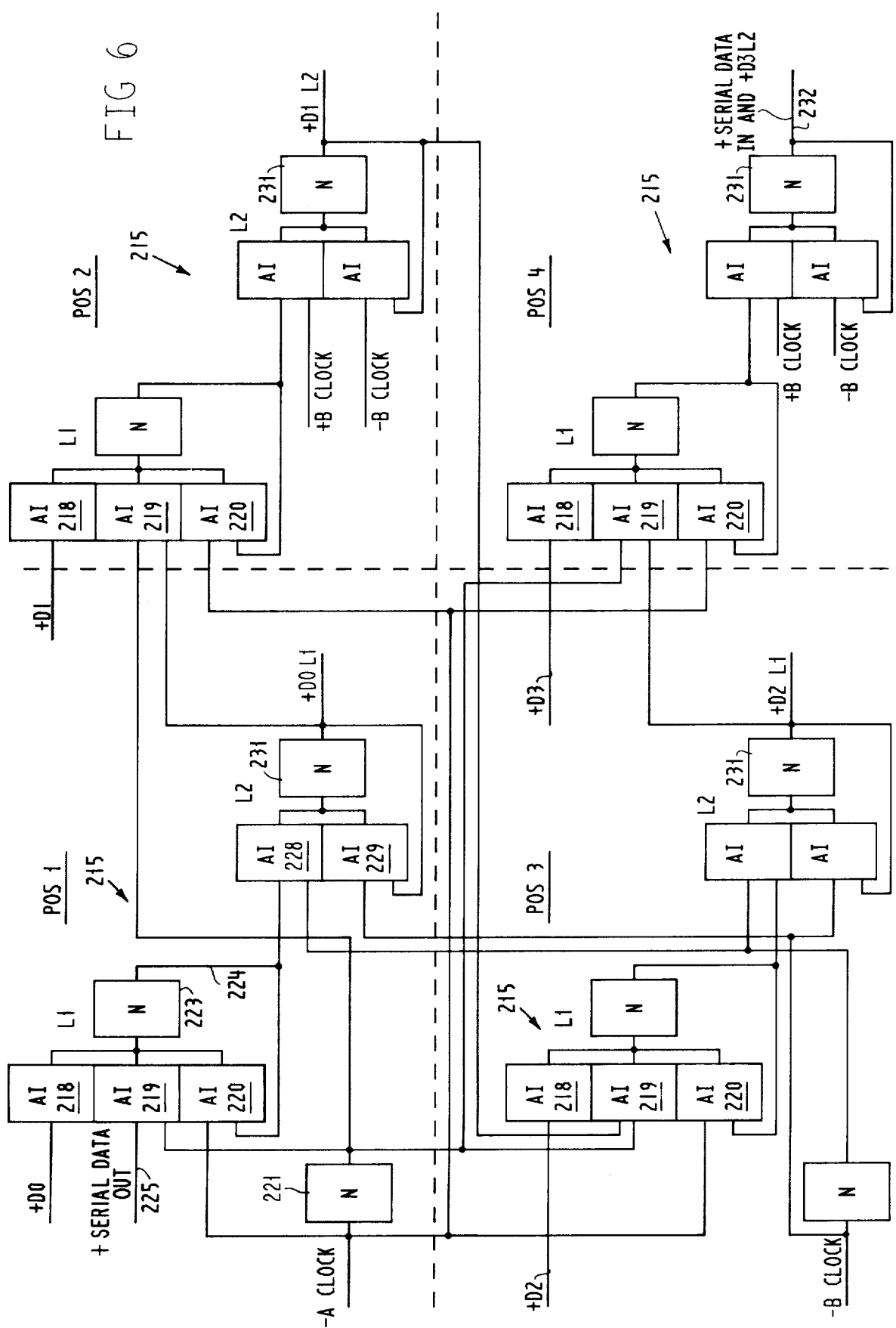

COMMON DIAGNOSTIC BUS FOR COMPUTER SYSTEMS TO ENABLE TESTING CONCURRENTLY WITH NORMAL SYSTEM OPERATION

BACKGROUND OF THE INVENTION

1. Field of the Invention

This invention relates to computer systems and more particularly to computer systems having system control adapters and still more particularly to computer systems having functional units constructed from LSI circuitry and organized so as to be responsive to signals from a system control adapter via a common RAS bus to go thru an operation.

2. Description of the Prior Art

Prior art arrangements for testing functional units within a computer system such as described in the IBM Technical Disclosure Bulletin Volume 12, No. 12, March 1970, page 1614 do not have direct addressing of the individual units to be tested and require simulation hardware. Some prior art arrangements such as in U.S. Pat. No. 3,806,878 dated Apr. 23, 1974, for Concurrent Subsystem Diagnostics and I/O Controller require use of a diagnostic instruction and do not have a separate RAS bus.

Other prior art such as in U.S. Pat. No. 3,825,901 dated July 23, 1974, for Integrated Diagnostic Tool does not have direct access to all triggers, registers and other elements of the computer system. Also, these prior art systems are unable to test the failing unit by means of a test pattern capable of testing the operation of individual logic elements. Rather, they use a functional test pattern and exercise the functional unit being tested, such as as ALU, to see if it operates in its intended manner. For example, a functional test pattern would be sent to the ALU to determine if it operates properly in the add mode, etc. There is no capability to test the operation of the individual logic elements irrespective of the operational mode of the unit being tested.

Additionally, these prior art systems are not capable of concurrent operation because they do not degate the failing functional unit and do not provide special system clocks to the failing functional unit. In the present invention each I/O type of functional unit can be degated from the remainder of the system. If the CPU is failing, it is not degated from the rest of the system. The degated functional unit can be separately addressed and furnished with system clocks for effecting one clock cycle, one shift cycle, one machine cycle or one instruction cycle, while the remainder of the system is operating with system clocks occurring in the normal system operation mode. Thus, the present invention is particularly suitable for computer systems operating with work stations. A failing work station can be tested while the remainder of the system continues to run in its normal mode. This is particularly advantageous over prior approaches where the entire system is dedicated to the test mode.

SUMMARY OF THE INVENTION

The principal objects of the invention are to provide improved apparatus in a computer system for loading test data serially into a functional unit and causing the same to go thru an operation which:

a. has access to all internal storage devices of a LSI chip or replaceable unit, b. has a common RAS bus connected to each functional unit of the computer system c. can separately address each individual functional unit of the computer system, and d. can exercise the addressed functional unit without utilizing the resources of the central processing unit (CPU) so as to enable concurrent operation of the CPU in the normal mode and operation of the failing unit in a test mode.

The foregoing objects are achieved by providing in the computer system a common bus which has an address line for each functional unit incorporated into the computer system. The common bus also includes lines for carrying test and control signals for causing the addressed functional unit to perform an operation. The test and control signals originate from a system control adapter which forms part of the computer system. Each I/O type of functional unit of the computer system includes logic for isolating the functional unit from the rest of the system upon being addressed and commanded to perform a test operation. Access to all internal storage devices of a functional unit is achieved by connecting the internal storage devices serially as one or more shift registers (if more than one shift register, a discrete address is required for each shift register). Hence, a test or functional pattern can be serially entered into the functional unit which is then caused to go through an operation and then the results are serially retrieved from the functional unit. Logic is contained in the system control adapter for providing each functional unit with system clocks controlled for testing purposes. In this manner, the addressed failing functional unit is provided with system clocks controlled for test purposes and the remainder of the system receives system clocks in the normal manner.

IN THE DRAWINGS

FIG. 1 is a block diagram illustrating a computer system incorporating the present invention;

FIGS. 2a, 2b and 2c taken together as shown in FIG. 2 represent a block diagram illustrating the system control adapter of FIG. 1 and showing the lines forming the common RAS bus;

Figure 5:
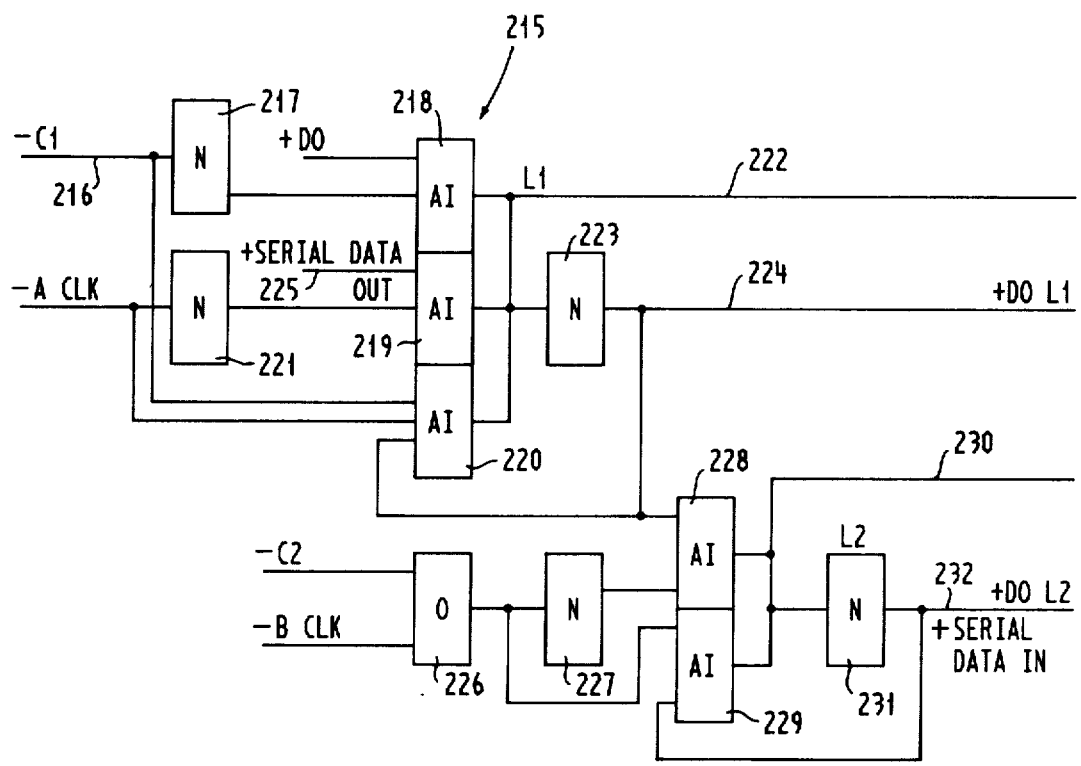
Figure 2A:
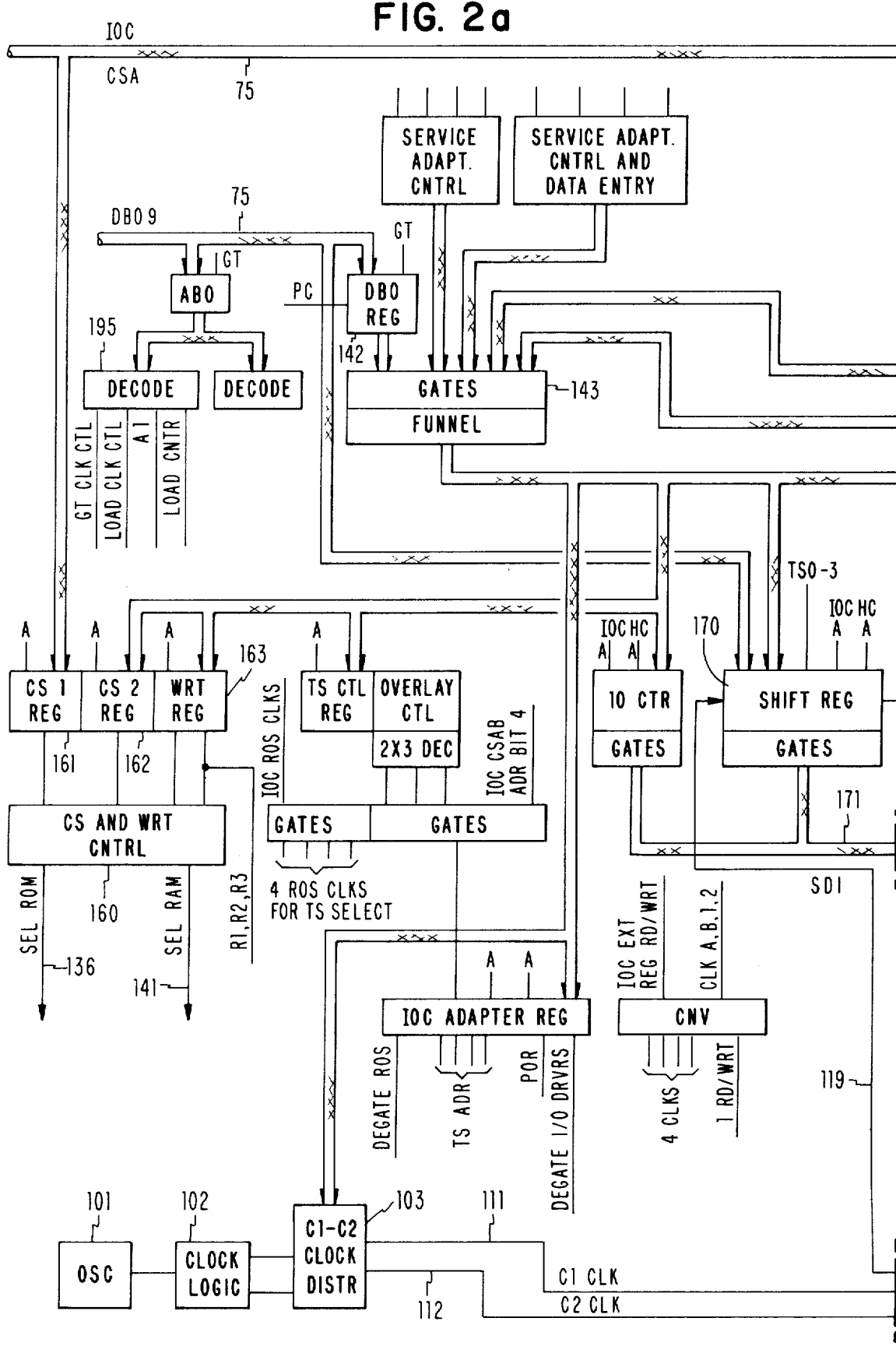
Figure 2B:
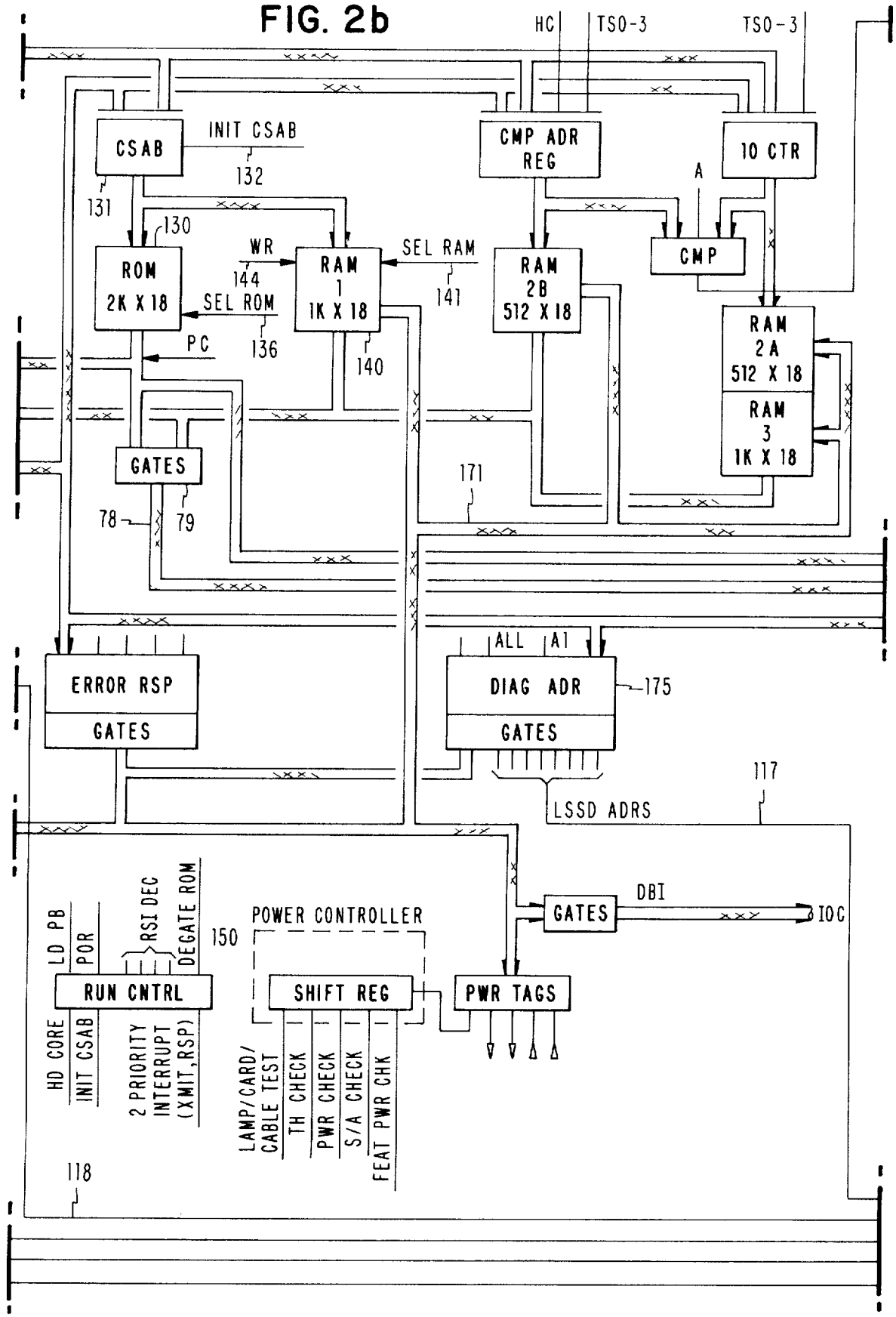
Figure 2C:
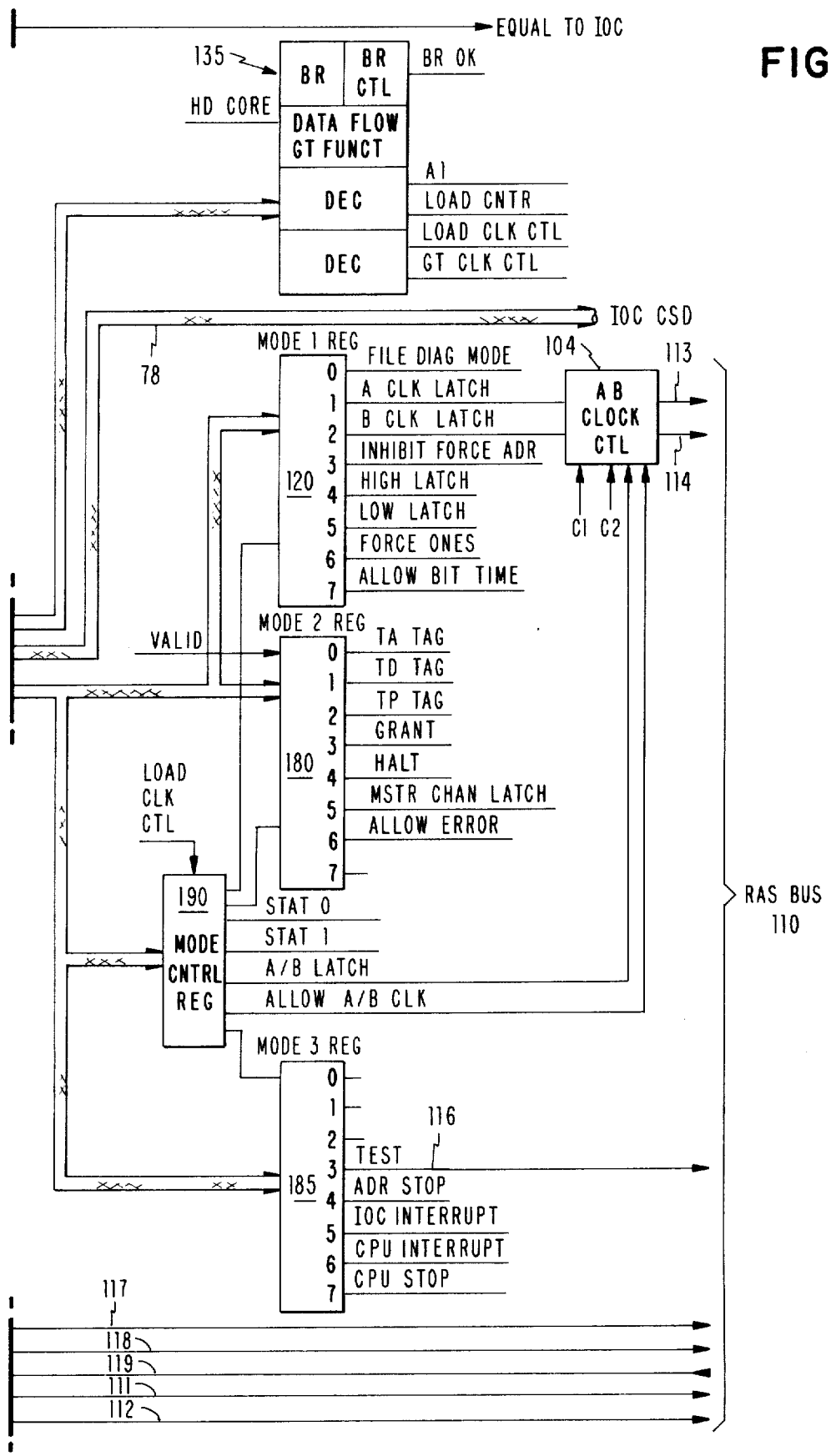
Figure 4:
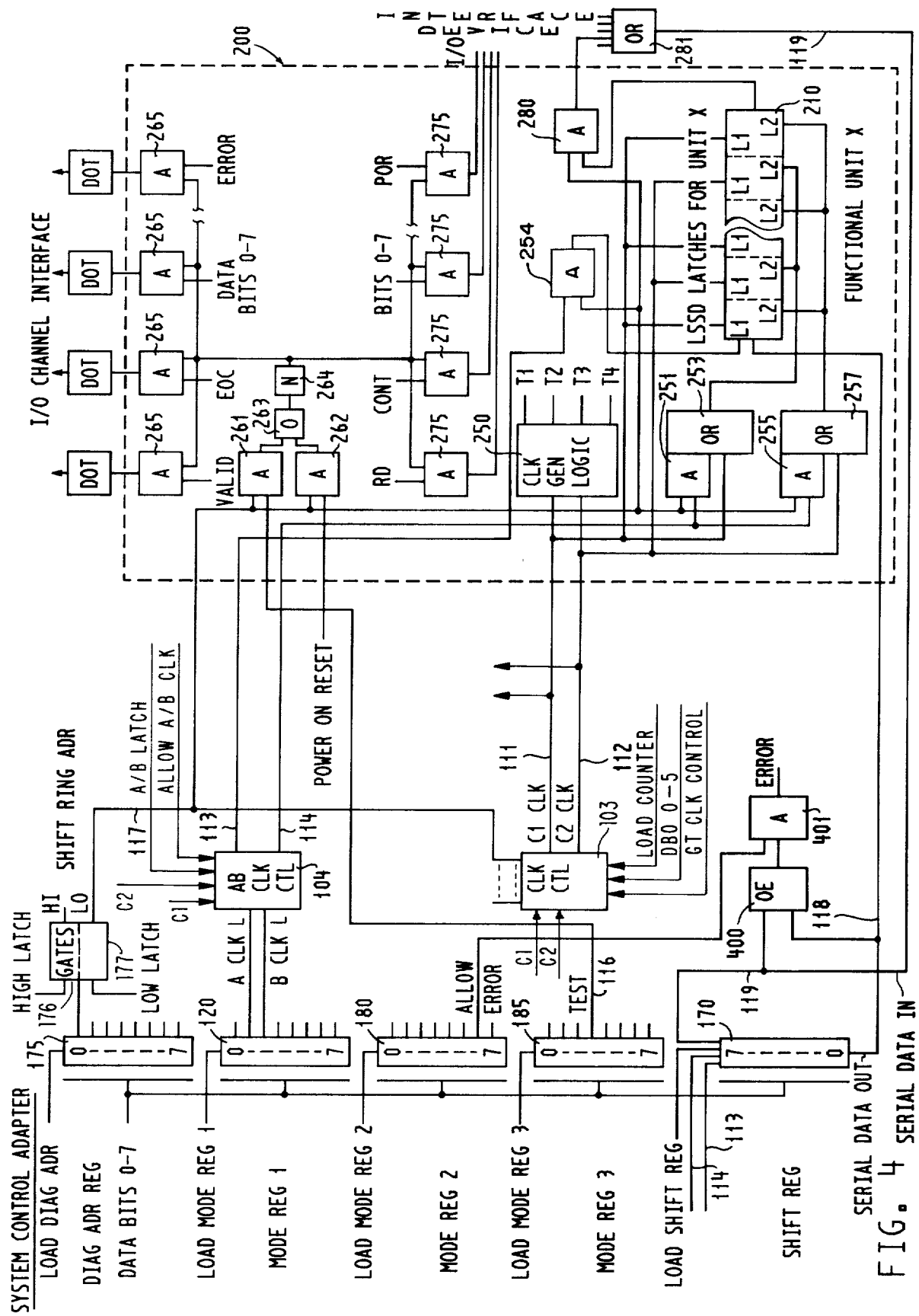
Figure 7:
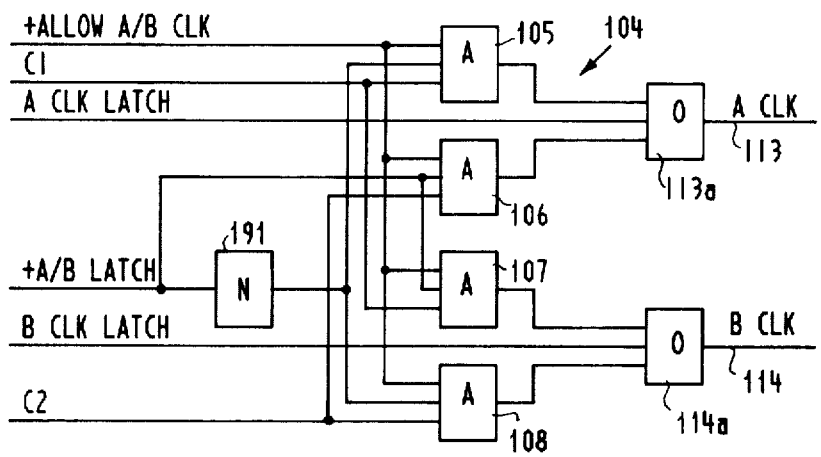
Figure 8:
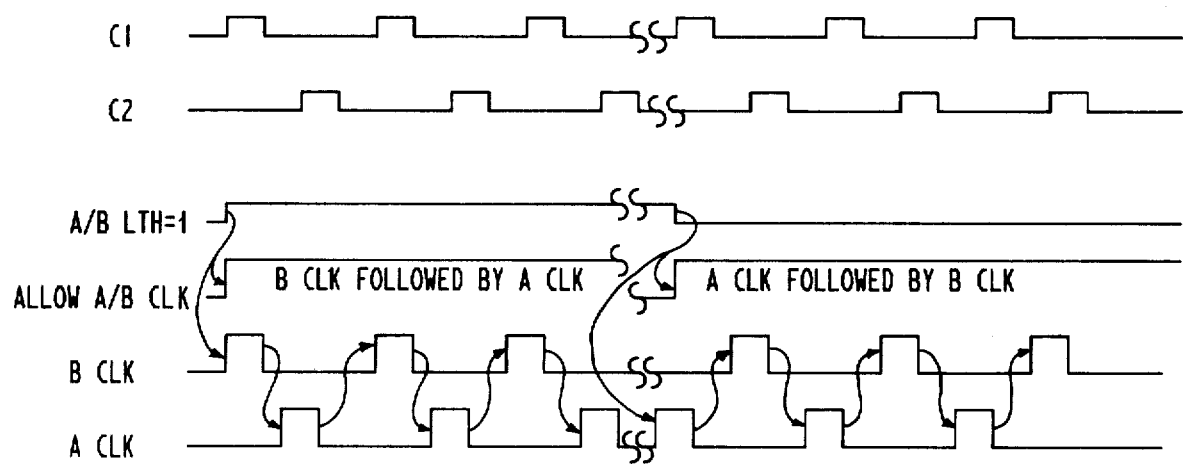
Figure 9:
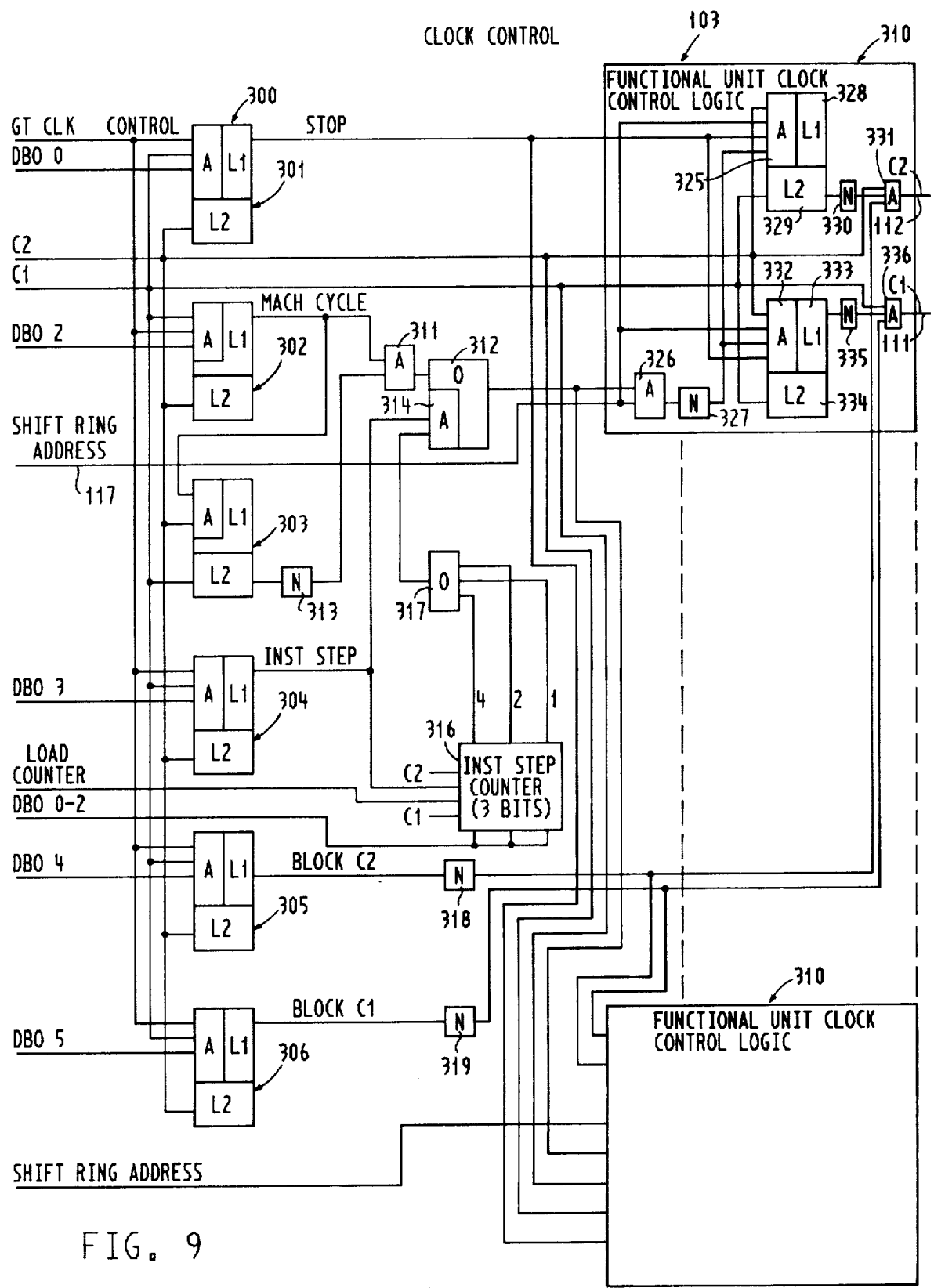
Figure 10:
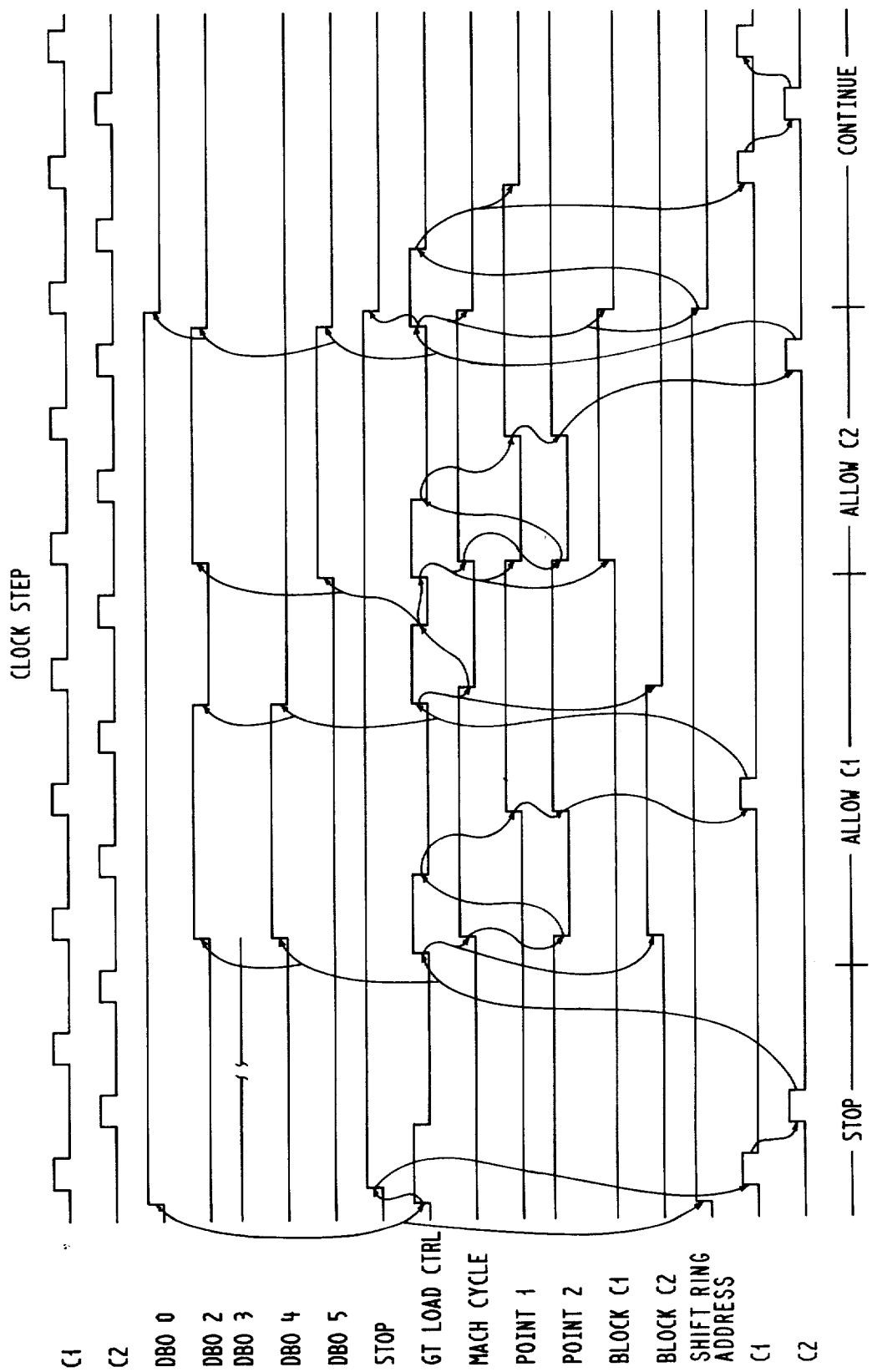
Figure 11:
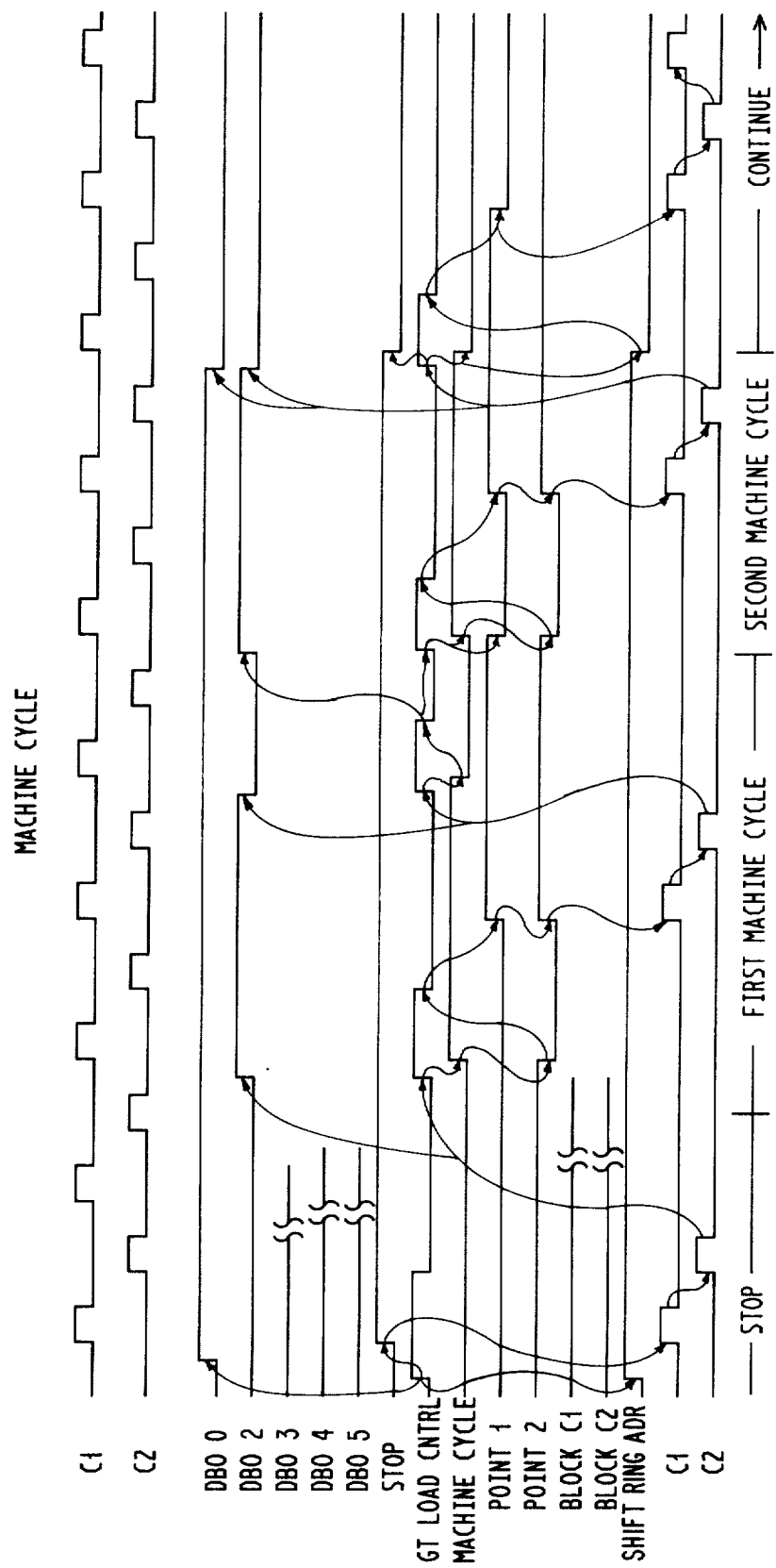
Figure 12:
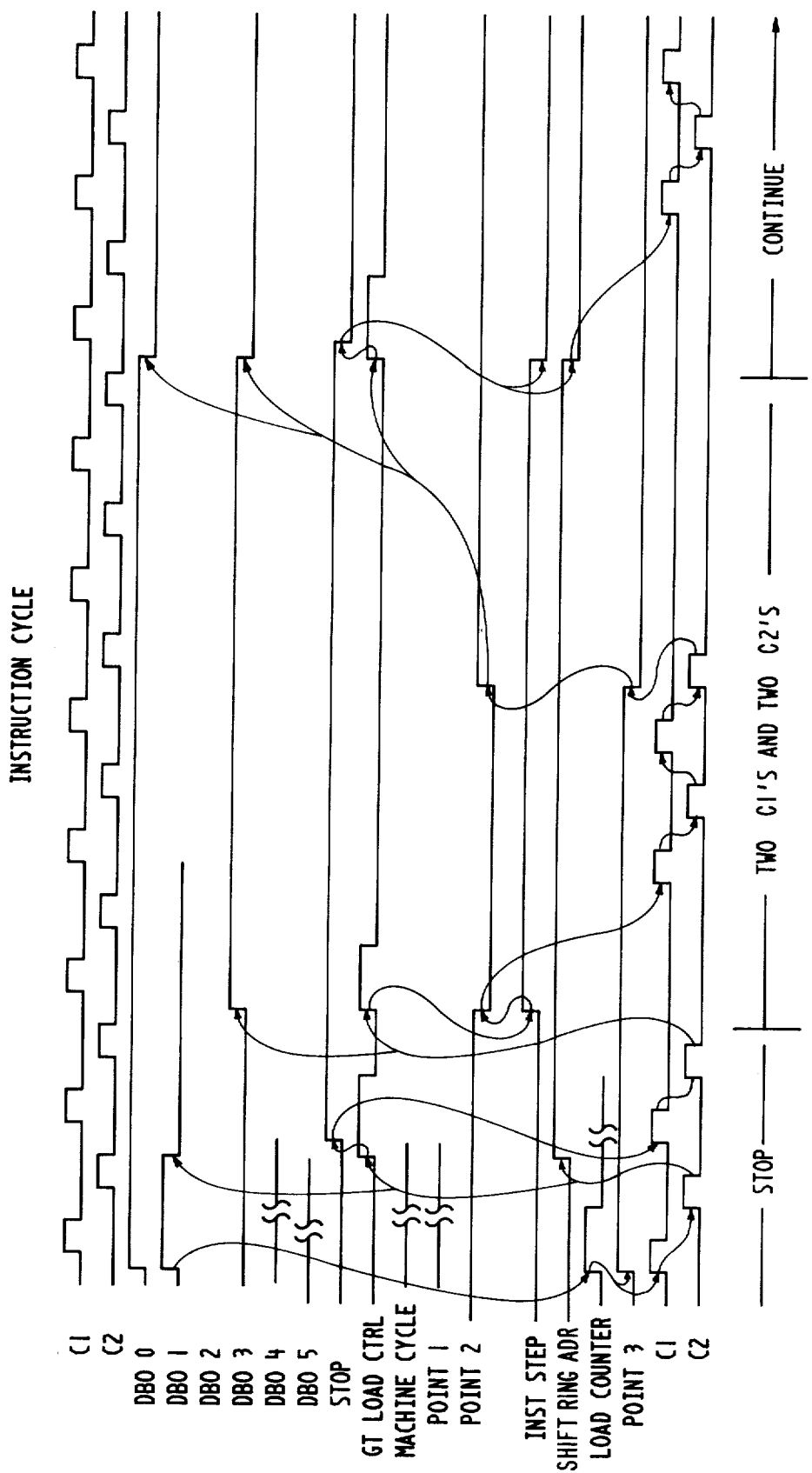

FIG. 4 is a logic diagram illustrating those elements of the system control adapter pertinent to providing signals for the common RAS bus and a typical functional unit including the logic for degating the functional unit and logic for controlling application of timing pulses to the functional unit, including a showing of the logic of the functional unit connected in a shift register ring configuration;

FIG. 5 is a schematic logic diagram illustrating a typical latch of the type used in a typical functional unit such as shown in FIG. 4;

FIG. 6 is a schematic logic diagram illustrating how the latches of a typical functional unit are connected for normal operation and in a shift register ring configuration for diagnostic purposes;

FIG. 7 is a schematic logic diagram illustrating the A, B clock control logic in the system control adapter;

FIG. 8 is a timing diagram illustrating the signals of FIG. 7 and showing how a B clock can be followed by an A clock and how an A clock can be followed by a B clock;

FIG. 9 is a schematic logic diagram of the C1, C2 clock control and distribution logic;

FIG. 10 is a timing diagram illustrating the control of the C1, C2 clock signals for a stop sequence followed by an allow clock C1, C2 step sequence;

FIG. 11 is a timing diagram illustrating the control of the C1, C2 clock signals for a stop sequence followed by C1, C2 clocks for a machine cycle sequence; and, FIG. 12 is a timing diagram illustrating the control of the C1, C2 clock signals for a stop sequence followed by C1, C2 clocks for an instruction cycle sequence.

DESCRIPTION

Figure 1:
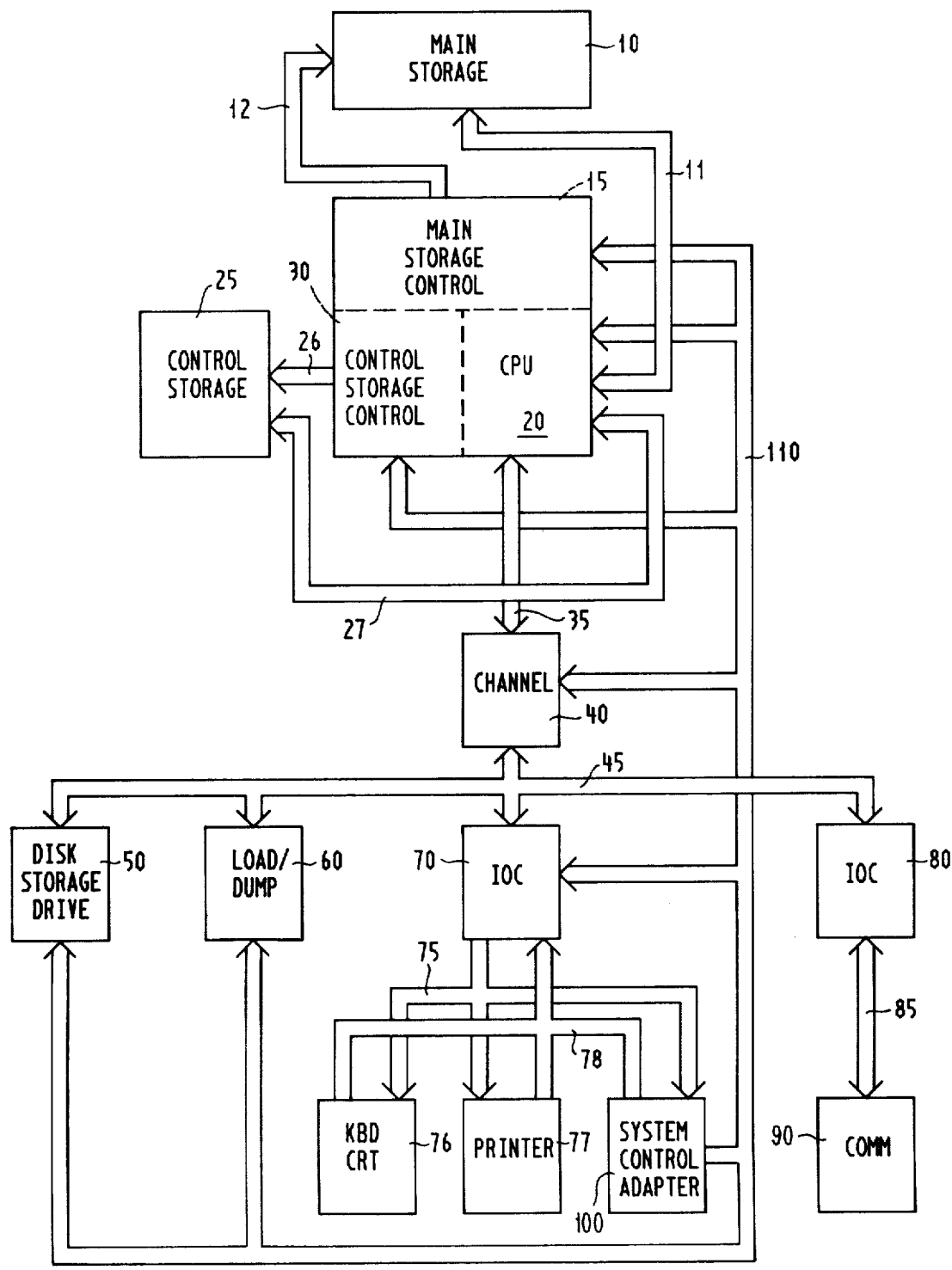

With reference to the drawings and particularly to FIG. 1, the invention is shown by way of example as being incorporated into a stored program computer system, which includes a conventional read/write main storage 10 for storing data. Storage 10 is accessed under control of a main storage control unit 15 located in central processing unit (CPU) 20. The data path between CPU 20 and storage 10 is represented by bus 11 while the address path is represented by bus 12.

Although storage 10 could contain instructions and data, the instructions are stored in a conventional read/write control store 25 which is accessed by control store control 30 in CPU 20. The address path is represented by bus 26 and the data path by bus 27. The CPU 20 interfaces to a channel 40 via bi-directional bus 35. Channel 40 is conventional and contains registers for buffering data transferring between CPU 20 and the I/O subsystem.

The I/O subsystem includes a disk storage drive 50 which stores programs and data for the system and subsystem. Programs and data can be entered into the system or unloaded therefrom by means of load dump unit 60. This unit is quite conventional and usually takes the form of a disk storage drive having one or more removable disks or a magnetic tape unit.

Other I/O devices are connected in the system by means of I/O controllers (IOC) 70 and 80. The IOC's 70 and 80 are structures as small control computers and include storage and a central processing unit.

The disk storage drive 50, load dump unit 60 and IOC's 70 and 80 are connected to channel 40 by bi-directional bus 45. IOC 70 controls I/O devices including a keyboard and cathode ray tube (CRT) represented by block 76, a printer 77 and system control adapter 100 which are connected to IOC 70 by busses 75 and 78. IOC 80 controls communication devices represented by block 90 which are connected to IOC 80 by bi-directional bus 85.

Functional units of the system, i.e., main storage control 15, CPU 20, control storage control 30, channel 40, disk storage drive 50, load dump 60 and IOC's 70 and 80 are connected to a common reliability and serviceability (RAS) bus 110 which also connects to system control adapter 100.

Figure 2:
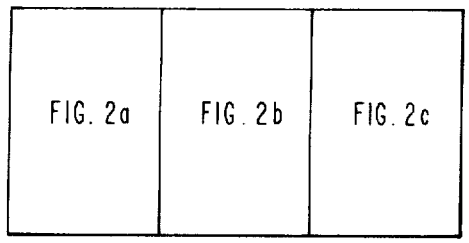
FIG. 2 is a diagram illustrating the arrangement of FIGS. 2a, 2b and 2c.

The system control adapter 100 is shown in detail in FIG. 2 and is structured like a small control computer except that it does not include an arithmetic and logic unit (ALU). It depends upon IOC 70 or 80 for such functions. If the computer system does not have IOC's, then the system control adapter 100 would have its own ALU, otherwise it would require resources of CPU 20 and this would permit concurrent operation of the system and the system control adapter 100.

System control adapter 100 contains the clock for the computer system. Oscillator 101 is a conventional crystal oscillator and provides pulses to clock logic 102. Clock logic 102 includes amplifiers and pulse shapers for forming clock pulses C1 and C2 which are fed to clock control and distribution logic 103. At this time, it is sufficient to note that clock control and distribution logic 103 enables the system control adapter to selectively discontinue clock pulses to any unit within the system and thereafter furnish C1 and C2 clocks for a clock step sequence, a machine cycle sequence or an instruction cycle sequence. The system control adapter 100 is also capable of providing A and B clocks for shift operations. These A and B clocks are under program control within the system control adapter and can occur at a rate determined by the program.

The clock lines 111 and 112 are representative for the clocks C1 and C2 for each functional unit within the computer system, i.e., there is a pair of clock lines for the clocks C1 and C2 for each functional unit and the clock lines 111 and 112 are part of the RAS bus 110. RAS bus 110 also includes lines 113 and 114 for the A and B clocks, line 116 for a test signal, line 117 which is actually a group of 16 lines for the functional unit or shift ring addresses, line 118 which is a serial data out line and line 119 which is a serial data in line. It should be noted that line 117 which consists of 16 conductors provides a discrete address for addressing each functional unit or each shift ring of each functional unit within the computer system or diagnostic purposes. This addressing capability is independent of addressing any functional unit in the computer system when executing the program in CPU 20.

The A and B clocks on lines 113 and 114, respectively, are used for diagnostic purposes and their particular function will be described in detail later herein. It is sufficient to note at this time that the A and B clocks occur at a rate under program control where the control is contained in block 104 which will be described in detail later herein. The A and B clocks originate from a mode 1 register 120 which is loaded under program control. The instructions forming the program for the system control adapter 100 reside in a read only memory (ROM) 130 and in a random access memory (RAM) 140. The instructions in ROM 130 provide the basic control for loading instructions into RAM 140 so as to render the system control adapter 100 operational, i.e., certain hardcore instructions in ROM 130 are very basic in nature and are for enabling the system control adapter to start functioning, for initializing the system control adapter, for establishing communication with an IOC and for loading RAM 140 with instructions from the disk storage drive 50 or the load dump device 60 via the IOC.

Figure 3A:
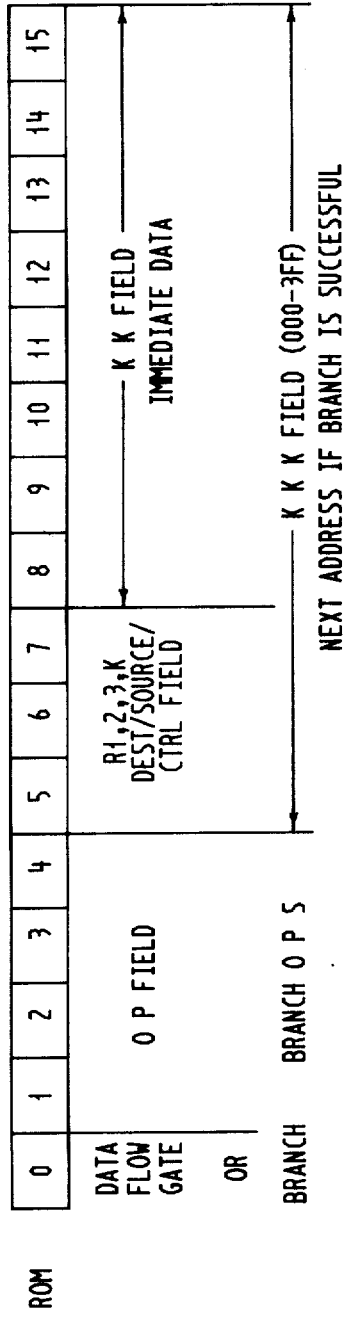
FIG. 3a is a diagram illustrating the instruction format of an instruction in ROM for operating in the hard core mode.

ROM 130 is addressed under control of address register 131 which is initially loaded or forced to a fixed address under control of a INIT CSAB signal on line 132 which comes from run control 150. The INIT CSAB signal in one instance results from a power on sequence for the computer system. The hardcore instruction in ROM 130 is shown in detail in FIG. 3a as consisting of 16 bits. Bit 0 is a data flow gate or branch bit. Bits 1–4 inclusive define an operation field or the branch operation to be performed if bit 0 indicates a branch condition. Bits 5–7 inclusive, when the operation is a data flow gate operation, define the destination, source or control field which is contained in bits 8–15 inclusive. If the operation is a branch operation, then bits 5-15 inclusive contain the address for the branch to instruction.

The instructions in ROM 130 are decoded by logic block 135 which includes logic for determining the type of operation to be performed, i.e., a data flow gate operation or a branch operation, logic for interpretting the operation field or the branch operation condition, logic for detecting the destination, source or control field, and logic for forming the branch to address.

Address register 131 is also used for addressing RAM 140. Select lines 136 and 141 from control block 160 determine whether ROM 130 or RAM 140 will be addressed. Control block 160 receives inputs from registers 161, 162 and 163. Register 161 is loaded with address data from IOC 70 via bus 75. It should be noted that bus 75 actually consists of lines for data and lines for addresses. Whether or not bus 75 includes both types of lines depends upon the particular implementation for the invention. For example, ROM 130 and RAM 140 could be contained in the IOC 70 and with such an implementationbus 75 would not include address lines.

The three high order bits of the address on bus 75 are entered into register 161. These three high order bits in this particular instance are used for developing the ROM and RAM select signals.

RAM 140 is loaded with instructions by executing an IOC instruction from ROM 130. In this instance, the instruction in ROM 130 is not decoded by decode logic 135 but rather it is passed by gates 79 to the IOC 70 via bus 78 and the instruction from ROM 130 is decoded in the IOC 70. When instructions from ROM 130 are decoded by logic 135, this is defined as the hard-core mode of operation and this hard-core mode of operation is to, as previously indicated, initialize the system control adapter 100, the IOC 70 and to initialize the disk storage drive 50 and the load dump device 60.

After the hard-core mode of operation is complete, the system control adapter switches into the IOC mode of operation where instructions from ROM 130 and from RAM 140 are decoded in the IOC 70. Hence the instruction from ROM 130 is decoded in IOC 70 and this causes IOC 70 to send an address via bus 75 to CSAB register 131. It will also be recalled that the high order bits of the address are placed into register 161 whereby control 160 develops select signals and in this instance a RAM signal is developed on line 141 for selecting RAM 140. IOC 70 then provides data on bus 75 to DBO register 142 and this data is passed via funnel gates 143 into shift register 170 which can operate in either a serial or parallel mode and in this instance is operating in a parallel mode whereby the data passes from register 170 to RAM 140 via bus 171. Thus, RAM 140 is loaded with a byte of data written therein under control of a write signal WR on line 144, there being a write signal for writing a low byte and a write signal for writing a high byte, i.e., RAM 140 is two bytes wide and the low byte is written first and another cycle is taken for writing the high byte. Thus another cycle of operation takes place for writing the high byte and repetitive cycles of operation for writing low and high bytes into RAM 140 are taken until RAM 140 is completely loaded. Instructions are then retrieved from RAM 140 for controlling the operation of the system control adapter. RAM 140 is in a read mode in the absence of a write signal WR on line 144.

Figure 3B:
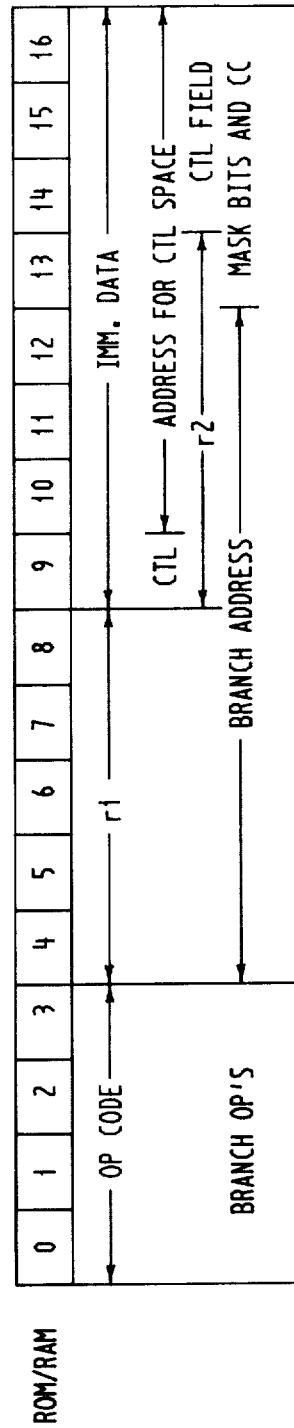
FIG. 3b is a diagram illustrating the instruction format of instructions in ROM or RAM for operating in the IOC mode.

When operating in the IOC mode, instructions have a format as shown in FIG. 3b. It should be noted that the format for the ROM and RAM instructions when in the IOC mode is the same, i.e., the ROM instructions in the IOC mode consists of 17 bits, ROM 130 is 18 bits wide. These 18 bits when in the hard core mode include 16 instruction bits and 2 parity bits. When in the IOC mode, these 18 bits include 17 instruction bits and one parity bit. RAM 140 is likewise 18 bits wide and essentially these 18 bits include two data bytes plus two parity bits; however, when in the IOC mode of operation, the 17 bits are used as instruction bits and one bit is used as a parity bit. It should be noted that when in the IOC mode of operation, the 17 bits require three cycles of operation, i.e., one cycle is used for writing the low byte, one cycle for writing the high byte and one cycle for writing the 17th bit and the parity bit. It should be noted that the present invention is not restricted to a 17 bit instruction but in this particular implementation, the IOC 70 operates with a 17 bit instruction. The significant aspects of the invention, as previously indicated, pertain to the arrangement for concurrent operation of the system and the failing functional unit.

In order to appreciate the present invention, it not only is necessary to understand the operation of the system control adapter 100, but it is also necessary to note that the elements of each functional unit are connected as shift registers in a manner as set forth in U.S. Pat. No. 3,806,891 dated Apr. 23, 1974, by Eichelberger et al for Logic Circuit for Scan In/Scan Out. A typical functional unit 200 is illustrated in FIG. 4 where the triggers and registers of that unit are shown as being connected in a shift register configuration 210. It should be understood that the triggers and registers of the functional unit only operate as one long shift register when in the diagnostic mode. This can be best understood by referring to FIG. 5 which illustrates a typical latch of functional unit 200 which operates in both the shift register and non-shift register modes. Latch 215 would be some latch in functional unit 200 for performing some typical latch function. Latch 215 when operating in the non-diagnostic mode is controlled for being set and reset by clocks C1 and C2. Clock C1 is applied to line 216 which feeds inverter 217 and AND Invert block 220 which forms part of the L1 latch of latch 215. The output of inverter 217 feeds AND Invert block 218 which also receives the data 0 (D0) input.

AND Invert block 219 is used for the serial shift operation and is fed by a +SERIAL DATA OUT signal and the output of inverter 221. Inverter 221 is fed by an A clock signal which is also applied to AND invert circuit 220. The outputs of AND invert circuits 218, 219 and 220 are dot ORed to provide a minus level output on line 222. The plus level on line 224 is taken from inverter 223 which is fed by the dot OR output of AND Invert circuits 218, 219 and 220. The output of inverter 223 is also fed back into AND Invert circuit 220 and to AND Invert circuit 228 of the L2 latch portion of latch 215. AND Invert circuit 228 is also fed by the output of inverter 227 which receives an input from OR circuit 226. OR circuit 226 receives clock signals C2 and circuit clock. The output of OR circuits 226 is also applied to AND Invert circuit 229. The outputs of AND Invert circuits 228 and 229 are dot ORed whereby the minus level output from the L2 portion of latch 215 is taken on line 230 and the plus level appears on line 232 which is connected to the output of inverter 231, same being fed by the dot OR output of AND Invert circuits 228 and 229. The output of inverter 231 is also fed back into AND Invert circuit 229.

Latch 215 essentially consists of two latches L1 and L2 which are connected without any control lines between them. The data in L1 and L2 are identical after clocks C1 and C2 have been applied to latch 215. However, when operating latch 215 as an element or position of a shift ring, clocks C1 and C2 are not applied, rather than A clock is applied to shift data into the L1 portion of latch 215 and the B clock is applied to transfer the data from the L1 portion to the L2 portion.

The connection of latches 215 to form a shift register is shown in greater detail in FIG. 6. More particularly FIG. 6 shows how four latches 215 are connected to form the shift ring. The output of inverter 231 of the latch 215 for position 1 is connected to the SERIAL DATA OUT input of and AND Invert block 219 of latch 215 for position 2. Similarily, the output of inverter 231 of latch 215 for position 2 is connected to the SERIAL DATA OUT input of the AND Invert block 219 of latch 215 for position 3 and the output of inverter 231 for this latch position is applied to the SERIAL DATA OUT input of AND Invert block 219 of latch 215 for position 4. The SERIAL DATA IN line 232 is taken from inverter 231 of position 4. The SERIAL DATA OUT signal comes from the system control adapter 100 over line 118 of the RAS bus 110 and the data appearing on the SERIAL DATA IN signal on line 232 is returned to the system control adapter 100 via line 119 of RAS bus 110.

The portion of the system control adapter 100 which is particularly significant with respect to the present invention is shown in FIG.. 4. The diagnostic address register 175 is an 8 bit register and the outputs thereof are encoded by means of high and low gate circuits 176 and 177, gated by HIGH LATCH and LOW LATCH signals, respectively, into 16 lines for discretely addressing any one of 16 functional units. The SHIFT RING ADDRESS signal on the address line 117 in combination with other signals from the system control adapter 100 is used for degating the functional unit from the system and for gating the B clock signal to the addressed functional unit.

The A clock and B clock signals originate from mode register 120. The signals are applied to A and B clock control 104 which is shown in detail in FIG. 7. The A clock latch and B clock latch signals directly feed OR circuits 113a and 114b, respectively. This arrangement enables the A clock and B clock signals to be generated under program control by repetitively setting and resetting register 120. The A clock signal can also be generated via AND circuits 105 and 106. These AND circuits are conditioned by an Allow A/B CLK signal which comes from register 190, FIG. 2. The sequence of occurrence for the A clock and B clock signals is determined by the setting of the A/B latch position of register 190. The output of this position is applied to AND circuit 105 via inverter 191. The other input to AND circuits 105 is the C1 clock signal. AND circuit 106 has an input directly connected to the output of the A/B latch of register 190 and an input connected to receive the C2 clock signal. Thus, if the A/B latch position of register 190 is set, then the A clock signal is produced by a C2 clock signal whereas if this position is reset the A clock signal is produced by the C1 clock signal.

The B clock signal can also be generated via AND circuits 107 and 108 in a manner similar to which the A clock signal is generated via AND circuits 105 and 106. AND circuit 107 is conditioned by the A/B latch signal from register 190 whereas AND circuit 108 is conditioned by the output of inverter 191. The C1 clock signal generates a B clock signal via AND circuit 107 when the A/B latch is set and the C2 signal generates the B clock signal via AND circuit 108 when the A/B latch is in the reset condition. Thus when the A/B latch is set, the C1 clock generates the B clock signal and the C2 clock generates the A clock signal. The result is that a B clock signal is generated first and is followed by the A clock signal. If the A/B latch is reset, the C1 clock signal generates the A clock and the C2 clock signal generates the B clock whereby the A clock signal occurs first and is followed by a B clock signal. The different A clock and B clock sequences are shown in the timing diagram of FIG. 8. The A and B clock signals on lines 113 and 114 are used as previously indicated for serially entering and retrieving test data from the triggers and registers connected as a shift register 210 in the functional unit 200.

The details of the clock control and distribution logic 103, FIGS. 2 and 4, for the C1 and C2 clock signals are shown in FIG. 9. Generally speaking, the clock control logic 103 provides a way for stopping the clock signals C1 and C2 with respect to the addressed functional unit and also enables the addressed functional unit after having been stopped to receive clock signals C1 and C2 selectively. Clock control logic 103 includes a 6 position register 300. The first position of register 300 is position 301 and it provides a STOP signal for stopping the C1 and C2 clocks to the particular addressed functional unit. Position 301 is controlled by a gate clock control signals GT CLK CONTROL from decode 195, FIG. 2, and the DBO 0 bit of bus 75. The C1 and C2 clock signals from clock logic 102 directly feed each functional unit clock control logic block 310 of clock control logic 103. Logic 103 includes as many clock control logic blocks 310 as there are addressable shift rings, i.e., at least one for each functional unit.

Position 302 of register 300 provides a MACHINE CYCLE signal depending upon the bit condition of bit DBO2. The MACHINE CYCLE signal is applied to the functional unit clock control logic 310 via AND circuits 311 and OR circuit 312. AND circuit 311 is conditioned by the output of inverter 313 which is connected to the L2 latch of position 303. The L1 latch of position 30 is fed by the MACHINE CYCLE signal and the C2 clock signal. The C1 clock signal feeds the L2 latch of position 303 whereas for all other positions of register 300, the C1 clock signal feeds the L1 latch of those positions. Thus the MACHINE CYCLE signal is present during a C1 clock signal and a C2 clock signal and drops with the next C1 clock signal because inverter 313 will then decondition AND circuit 311.

Position 304 of register 300 is set by a DBO 3 bit and when set provides an INSTRUCTION STEP signal which is applied to AND circuit 314 which feeds OR circuit 312. The INSTRUCTION STEP signal also feeds an instruction step counter 316. Counter 316 is loaded from DBO bits 0–2 inclusive under control of a LOAD COUNTER signal from decode logic 195, FIG. 2. Counter 316 is decremented by the clock signals C1 and C2 when the INSTRUCTION STEP signal is available from position 304. The outputs of counter 316 feed OR circuits 317 and its output is applied to AND circuit 314. AND circuit 314 is conditioned by a signal from OR circuit 317 whenever the value in counter 316 is other than zero. When counter 316 is zero, AND circuit 314 is inhibited. Thus the INSTRUCTION STEP signal is passed by AND circuit 314 to OR circuit 312 so long as counter 316 is at a value other than zero.

Position 305 of register 300 is set by DBO bit 4 and provides a BLOCK C2 signal which feeds inverter 318. The output of inverter 318 feeds AND circuit 331 of the functional unit clock control logic blocks 310. Position 306 of register 300 is set by the DBO 5 bit and it provides a BLOCK C1 signal to inverter 319. The output of inverter 319 is fed directly to AND circuit 336 of the functional unit clock control logic blocks 310.

Each functional unit clock control logic block 310 is identical and a previously indicated there are at least as many blocks 310 as there are functional units. Thus each functional unit clock control logic block has the same inputs except for the discrete SHIFT RING ADDRESS input line 117. The functional unit clock control logic block 310 for the SHIFT RING ADDRESS used for addressing functional unit 200 is shown in detail and includes AND circuit 325 which receives the STOP signal from position 301 of register 300, the C2 clock signal, the SHIFT RING ADDRESS signal and the output of an inverter 327 which is fed by AND circuit 326. AND circuit 326 receives the output of OR circuit 312 and the SHIFT RING ADDRESS signal. AND circuit 325 controls the setting of the L1 latch 328. The L2 latch 329 of the latch pair is set by the output of the L1 latch 328 and the C1 clock signal. The output of the L2 latch 329 feeds inverter 330 which provides an input to AND circuit 331. AND circuit 331 also receives the C2 clock signal and the output of inverter 318. AND circuit 331 provides a C2 clock signal on line 112 if it is not inhibited by either inverter 318 or 320.

L1 latch 333 is set under control of AND circuit 332 which receives the C2 clock signal, the SHIFT RING ADDRESS signal, the output of inverter 327 and the STOP signal from position 301. The L2 latch 334 of the latch pair receives the C1 clock signal. The output of the L1 latch 333 feeds inverter 335 which in turn provides an input to AND circuit 336. AND circuit 336 also reveives the C1 clock signal and the output of inverter 319. AND circuit 336 provides a C1 clock signal on line 111 if it is not inhibited by inverters 319 or 335.

By the arrangement just described, control is provided to block the C1 and C2 signals and thereafter to selectively allow the occurrence of either in a predetermined sequence as seen in FIGS. 10, 11 and 12. Specifically, when position 301 provides the STOP signal to AND circuits 325 and 332, AND circuit 325 sets L1 latch 328 and AND circuit 332 sets L1 latch 333 upon the occurrence of a clock C2 signal. Latch 333 then by means of inverter 335 inhibits AND circuit 336 so as to block the passage of the C1 clock signal to the particular functional unit being addressed. The C1 clock signal, however, transfers the condition of latch 328 into latch 329 whereby latch 329 by means of inverter 330 inhibits AND circuit 331 from passing the C2 clock signal to the functional unit being addressed.

Clock steps, i.e., a C1 clock or a C2 clock, can be sent to the functional unit being addressed by appropriately loading positions 302, 305 and 306. Position 302 provides the MACHINE CYCLE signal whereby AND circuit 326 inhibits AND circuits 325 and 332 via inverter 327. Thus, AND circuits 331 and 336 are no longer inhibited by this path, however, positions 305 and 306 could still provide inhibiting signals to these AND circuits respectively. The C1 clock step signal under the conditions just described would be effected by having position 306 set to a 0 condition. A C2 clock step signal is provided by having position 305 set to a 0 condition. A clock step sequence is shown in FIG. 10.

A machine cycle is a sequence of C1 clock signal followed by a C2 clock signal. Thus, for a machine cycle, positions 305 and 306 must be both set to the 0 condition. A machine cycle sequence is illustrated in FIG. 11.

An instruction step signal is variable depending upon the value set into counter 316. In this particular example, the instruction cycle, FIG. 12, can be a sequence of a C1 clock signal followed by a C2 clock signal, a second C1 clock signal followed by a second C2 clock signal, if counter 316 is set to 4, or 3 C1 signals and three C2 signals if counter 316 is set to six, where each C1 signal of the 3 C1 signals is followed by a C2 signal of the 3 C2 signals.

The C1 and C2 clock signals from the functional unit clock control logic 310 feed the functional unit 200 via lines 111 and 112, respectively. Specifically clock C1 and C2 are shown as feeding clock generation logic 250, FIG. 4. Whether or not a functional unit would have clock generation logic 250 depends upon the requirements of the particular functional unit. Hence by way of example, functional unit 200 is shown as having a need for clocks T1 – T4 for its normal operation. However to simplify the drawing, functional unit 200 is considered to require only clocks C1 and C2. Clock C1 is applied via Or circuit 253 to the triggers, latches and registers of functional unit 200 for their normal operation. The output of OR circuit 253 is shown as being applied to the alternate L2 latches of the functional unit because the L1, L2 latch design concept does not permit the transfer of data between latches that are gated with the same clock pulse. This requirement is set forth in detail in U.S. Pat. No. 3,783,254 dated Jan. 1, 1974, by Eichelberger for "Level Sensitive Logic System." the C1 and C2 clock signals are also applied to alternate L1 latches so as to operate the L1, L2 latches in the normal manner. Clock signal C2 feeds OR circuit 257 and its output is applied to alternate L2 latches of the latch pairs having the L1 latches thereof clocked by the C1 clock signal. AND circuits 255 functions in a manner similar to AND circuit 251 in that it has the same inputs; however, it feeds OR circuit 257 rather than OR circuit 253.

In order to operate the L1 and L2 latches as a shift register 210, AND circuits 251 which is conditioned by the SHIFT RING ADDRESS signal also receives the B clock signal from A B clock control 104 over line 114 whereby the signal passed by AND circuit 251 is passed by OR circuit 253 to the L2 latches as shown. The A clock signal feeds the L1 latches of the shift register 210 via AND circuit 254. The first L1 latch also receives the SERIAL DATA OUT line from register 170. The output of the last position of shift register 210 is fed to AND circuit 280 which is conditioned by the SHIFT RING ADDRESS signal on line 117. The output of AND circuit 280 feeds OR circuit 281. OR circuit 281 also has inputs from other functional units and its output is the SERIAL DATA IN input to register 170.

When the functional unit 200 is being operated in other than its normal mode, register 175 provides a SHIFT RING ADDRESS signal on line 117 and register 185 provides a TEST signal on line 116 to AND circuit 261. AND circuit 261 feeds OR circuit 263 which in turn feeds inverter 264. OR circuit 263 also receives an input from AND circuit 262. AND circuit 262 receives the SHIFT RING ADDRESS signal and a power on reset (POR) POR signal. The output of inverter 264 provides an inhibit signal to AND circuits 265 so as to degate functional unit 200 from the I/O channel interface which could be the busses 75 or 85 leading to the IOC's 70 or 80 or the bus 45 leading to channel 40. The inhibit signal from inverter 264 is also applied to AND circuits 275 for degating the functional unit from its associated I/O device.

When in the non-normal mode, the shift register 210 of the functional unit is loaded serially with data patterns from register 170. Register 170 can be loaded in parallel with the desired data pattern. Then A and B clock pulses are applied to register 170 over lines 113 and 114, respectively, for shifting the data out over line 118 to the L1 latch of the first position of shift register 210 of the functional unit 200. Shift register 210 is shifted by A and B clocks and the output of register 210 is applied to AND circuit 280 which is conditioned by the SHIFT RING ADDRESS signal as previously indicated. The output of AND circuit 280 feeds OR circuit 281 and its output is the SHAFT DATA IN line 119 which is returned to shift register 170. OR circuit 281, which is merely representative of the OR logic function, receives inputs from the other functional units 200. OR circuits 281 would normally be a dot OR connection.

The SERIAL DATA OUT line 118 and the SERIAL DATA IN line 119 are also applied to exclusive OR circuit 400. This arrangement enables the data retrieved from shift register 210 to be compared serially, bit by bit, with an expected result pattern loaded into register 170. The output of exclusive OR circuit feeds AND circuit 401 which is conditioned by an allow error signal from register 180. The output of AND circuit 401 is an error signal which is used by the system control adapter 100.

What is claimed is:

1. In a computer system having a central processing unit (CPU), an I/O channel unit with I/O adapters units connected thereto with at least one I/O adapter unit being a system control adapter, said units including internal storage elements connected for operation in a normal mode and connected serially as a shift ring for operation in a diagnostic mode, the improvement comprising:
   means in said system control adapter for discretely addressing each unit of said computer system,
   means in said system control adapter for providing a test signal to each unit of said computer system, and
   means in each unit of said computer system responsive to being addressed and to receiving said test signal for inhibiting normal mode operation and enabling diagnostic mode operation of said internal storage elements in said responsive unit.

2. The computer system of claim 1 wherein a unit enabled for diagnostic mode operation of said internal storage elements is tested by said system control adapter concurrently with operation of said computer system provided said unit enabled for diagnostic mode operation of said internal storage elements is other than said CPU.

3. The computer system of claim 1 wherein said system control adapter includes means for providing data and clocking signals to said internal storage elements of a unit enabled for diagnostic mode operation, said clocking signals causing said enabled unit to perform a predetermined operation.

4. The computer system of claim 3 wherein said system control adapter further includes means for retrieving data from said internal storage elements of a unit enabled for diagnostic mode operation.

5. The computer system of claim 3 wherein said system control adapter provides clocking signals to said internal storage elements of a unit enabled for diagnostic mode operation to effect one clock cycle of operation.

6. The computer system of claim 3 wherein said system control adapter provides clocking signals to said internal storage elements of a unit enabled for diagnositic mode operation to effect one shift cycle of operation.

7. The computer system of claim 3 wherein said system control adapter provides clocking signals to said internal storage elements of a unit enabled for diagnostic mode operation to effect one instruction cycle of operation.

8. In a computer system having a CPU unit and including an I/O channel unit with I/O adapter units connected thereto with at least one I/O adapter unit being a system control adapter with means for addressing all other units, means within said system control adapter for providing serial data to an addressed unit and means within said system control adapter for providing a plurality of common diagnostic control signals to an addressed unit, said units having internal serially connected storage elements which can be set to predetermined states by said system control adapter, the improvement comprising:
   first logic means includes in each of said units responsive to an address signal and one of said control signals from said system control adapter to block data from passing between said addressed unit and all other units except said system control adapter,
   second logic means in each of said units responsive to other of said control signals for initiating a diagnostic operation in said addressed unit,
   sensing means for detecting completion of said diagnostic operation, and
   means within said system control adapter responsive to said sensing means detecting completion of said diagnostic operation for retrieving serial data from said addressed unit after said diagnostic operation has been executed.

9. The computer system of claim 8 further comprising
   means within said system control adapter for testing said retrieved serial data.

10. In a computer system including a CPU unit, an I/O channel unit with I/O adapter units connected thereto with at least one I/O adapter unit being a system control adapter, said units including internal storage elements connected for operation in a normal mode and connected serially as a shift ring for operation in a diagnostic mode, said system control adapter including addressing means for selectively providing address signals to each of said units, means for providing a control signal to each of said units, shift clocking means for selectively providing shift clock signals to each of said units, means for providing serial data to each of said units, and means for receiving serial data from each of said units, said computer system further including, a bus connecting said system control adapter to each of said units for transmitting thereto said address signals, said control signal, said shift clock signals, said serial data and for receving therefrom said serial data, data entry control means in each of said units responsive to an address signal and said shift signals for controlling entry of said serial data into said internal storage elements from said system control adapter via said bus, and means in each of said units responsive to said control signal from said system control adapter via said bus for providing diagnostic clock signals to cause the associated unit having serial data entered therein to modify said serial data.

11. The computer system of claim 10 where said diagnostic clock signals cause said associated unit having serial data entered therein to effect one clock cycle of operation for modification of said serial data.

12. The computer system of claim 10 where said diagnostic clock signals cause said associated unit having serial data entered therein to effect one shift cycle of operation for modification of said serial data.

13. The computer system of claim 10 where said diagnostic clock signals cause said associated unit having serial data entered therein to effect one instruction cycle of operation for modification of said serial data.

14. The computer system of claim 10 further comprising:

means responsive to said address signal and said shift clock signals for controlling exiting of modified serial data from a unit having serial data therein modified by said diagnostic clock signals.

15. The computer system of claim 14 further comprising
    analyzing means for analyzing said modified serial data.

16. The computer system of claim 15 wherein said analyzing means is in said system control adapter.

17. The computer system of claim 16 wherein siad analyzing means in said system control adapter comprises a shift register containing an expected result pattern, means for shifting said shift register in synchronization with said exiting modified serial data, means for serially comparing said expected result pattern shifted from said shift register with said exiting modified serial data, and means for indicating any non comparison between said expected result pattern and said modified serial data.

18. In a computer system having a plurality of functional units including a central processing unit, an I/O channel unit connected to said central processing unit and I/O adapter units connected to said channel unit with at least one I/O adapter unit being a system control adapter, said system control adapter including means for generating address signals for discretely addressing said functional units, means for generating a control mode signal, means for providing serial data to and for receiving serial data from said functional units, and means for generating timing signals, each functional unit including internal storage elements connected for independently and serial operation the improvement comprising:

bus means connecting said system control adapter directly to each of the other units in said computer system, said bus means including address lines for carrying said address signals from said system control adapter to directly address each of said other units, a control line for applying said control mode signal generated by said system control adapter for each of said other units, a data line for transmitting serial data provided by said system control adapter to each of said other units, a data line for transmitting serial data from each of said other units so said system control adapter, and lines for transmitting said timing signals to each of said other units whereby an addressed other unit receiving a control mode signal isolates itself from other units of said computer system other than said system control adapter and becomes conditioned to receive and send serial data from and to system control adapter under control of said timing signals.

19. In a computer system having a plurality of functional units including a central processing unit, an I/O channel unit connected to said central processing unit and I/O adapter units connected to said channel unit with at least one I/O adapter unit being a system control adapter unit, said units including internal storage elements connected for normal operation and connected serially as a shift ring, said internal storage elements having clock inputs and data inputs for normal operation and timing inputs and serial data inputs for serial data scan in and scan out, the improvement comprising:

means in said system control adapter unit for discretely addressing each functional unit of said computer system, means in said system control adapter for providing clock control signals to each functional unit, a source of clock signals for said internal storage elements, clock control means for each functional unit connected to receive said clock signals from said source of clock signals and said clock control signals from said system control adapter and responsive to said clock control signals to selectively inhibit and allow transmission of said clock signals to said clock inputs of said internal storage elements of an addressed functional unit, means in said system control adapter for selectively providing timing signals to each functional unit, means in each functional unit responsive to the associated functional unit being addressed for applying said timing signals to said timing inputs of said internal storage elements in said associated functional unit, and means in said system control adapter for providing serial data to said serial data inputs of said internal storage elements in each functional unit whereby said serial data is set into the internal storage elements of said addressed functional unit as said timing signals are applied to said timing inputs while said clock signals are inhibited from said clock inputs under control of said clock control means and whereby said serial data set into said internal storage elements is modified as said clock signals are allowed to be transmitted to said clock inputs under control of said clock control means.

* * * * *